United States Patent
LaFemina

(10) Patent No.: US 10,215,384 B2
(45) Date of Patent: Feb. 26, 2019

(54) EXTENSION MODULE WITH HOUSING FOR ELECTRONIC COMPONENTS

(71) Applicant: The Pennsylvania Globe Gaslight Company, North Branford, CT (US)

(72) Inventor: Marcia LaFemina, Madison, CT (US)

(73) Assignee: The Pennsylvania Globe Gaslight Co., North Branford, CT (US)

( * ) Notice: Subject to any disclaimer, the term of this patent is extended or adjusted under 35 U.S.C. 154(b) by 0 days.

(21) Appl. No.: 15/496,250

(22) Filed: Apr. 25, 2017

(65) Prior Publication Data

US 2017/0307192 A1    Oct. 26, 2017

Related U.S. Application Data

(60) Provisional application No. 62/326,972, filed on Apr. 25, 2016.

(51) Int. Cl.

| E04H 12/24 | (2006.01) |
|---|---|
| F21V 21/108 | (2006.01) |
| F21V 21/10 | (2006.01) |
| H05K 1/18 | (2006.01) |

(52) U.S. Cl.
CPC ........... *F21V 21/108* (2013.01); *E04H 12/24* (2013.01); *F21V 21/10* (2013.01); *H05K 1/182* (2013.01)

(58) Field of Classification Search
CPC .................................. H04B 1/03; E04H 12/24
See application file for complete search history.

(56) References Cited

U.S. PATENT DOCUMENTS

| 776,360 | A | 11/1904 | Slinack |
|---|---|---|---|
| 1,575,245 | A | 3/1926 | Wurdack |
| D338,977 | S | 8/1993 | Ewing et al. |
| 6,474,848 | B1 | 11/2002 | Lahner et al. |
| 7,922,372 | B2 | 4/2011 | Li |
| 8,076,593 | B2* | 12/2011 | Centner .................. B60R 11/02 174/382 |
| 8,337,100 | B2 | 12/2012 | Jung et al. |
| 2005/0243576 | A1 | 11/2005 | Park et al. |
| 2009/0046460 | A1 | 2/2009 | Li |
| 2009/0073680 | A1* | 3/2009 | Sandoval .................. F21S 8/06 362/216 |
| 2011/0158637 | A1 | 6/2011 | Jung et al. |
| 2011/0188241 | A1 | 8/2011 | Walczak et al. |
| 2014/0227985 | A1* | 8/2014 | Sanford ............. H01Q 21/0087 455/90.3 |

* cited by examiner

*Primary Examiner* — Hung V Ngo
(74) *Attorney, Agent, or Firm* — Murtha Cullina LLP

(57) ABSTRACT

A fixture for an elongate structure includes an extension module having a housing secured therearound. The extension module includes a longitudinal body portion having first connector and a second connector. One or more access ports extend through the longitudinal body portion and into an interior area of the longitudinal body portion. The extension module includes a first seating surface and a second seating surface. The housing includes a first axial cover extending radially and a second axial cover each extending radially outward from the longitudinal body. The first axial cover and the second axial cover are axially spaced apart from one another and define a space therebetween and around the longitudinal body portion. A circumferential cover extends circumferential around radially outermost edges of the first axial cover and the second axial cover and surrounding the space.

24 Claims, 17 Drawing Sheets

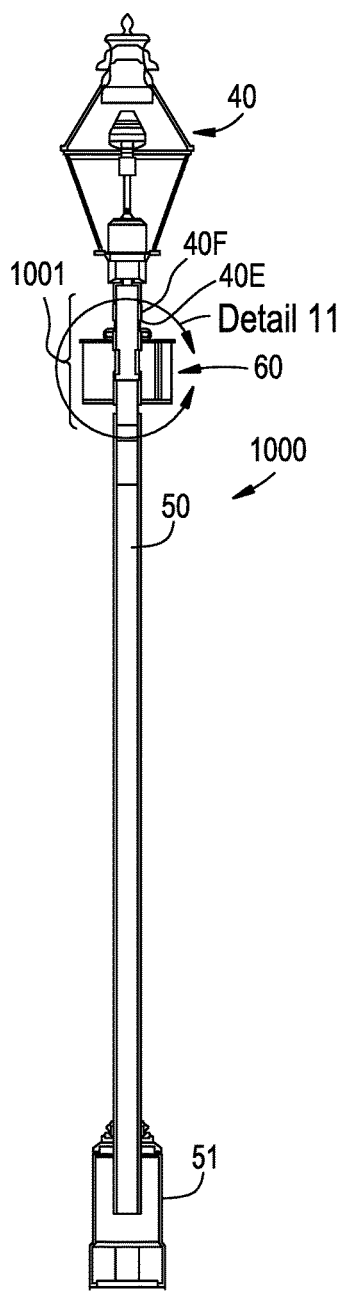
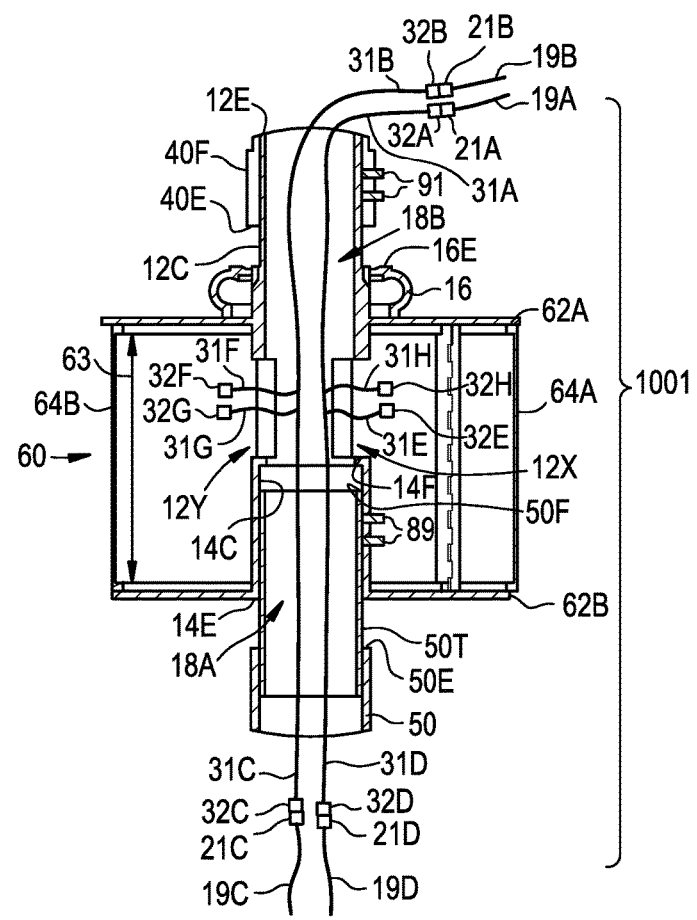

EXTENSION MODULE WITH HOUSING FOR ELECTRONIC COMPONENTS

TECHNICAL FIELD

The present disclosure generally relates to an extension module with a housing for electronic components and more specifically to a street light pole extension module with two or more pole connectors and having a housing. The extension module and the housing are disposed between a lighting fixture and the pole and the housing has electronic components therein and/or thereon including but not limited to electrical connectors, antennas, power supply, computer processor control unit, AC/DC converter, cameras, speakers, internet connection and sensors such as temperature, humidity, barometric pressure, sound, smoke and radiation sensors.

BACKGROUND

There are many types of exterior lighting systems including those mounted on poles, building structures, frames and bridges. For example, as shown in FIG. 1 a typical street light assembly 100 includes a pole 112 secured to a base 114 and having a lighting fixture 116 removably secured to an upper end 112U of the pole 112. The pole 112 is typically tubular and provides an interior channel 112C through which electrical conductors 118 extend and terminate in the lighting fixture 116. The pole 112 has a support flange 120 extending radially outward from the pole 112, proximate the upper end 112U. A male connector 112C (e.g., a cylindrical tube) extends axially outward from the flange 120. The lighting fixture 116 has an aperture 116A (e.g., a cylindrical hole) extending into the mounting portion 116M of the lighting fixture 116. The aperture 116A has a shape and size configured to receive the male connector 112C. When assembled, the aperture 116A is fitted over the male connector 112C so that a bottom surface 116B of the mounting portion 116M seats on an upper surface 120U of the support flange 120 to support the weight and position of the lighting fixture relative to the pole 112. Typically, one or more fasteners (e.g., set screws or pins) 122 are threaded through respective bores in the mounting portion 116M and frictionally engage an exterior surface of the male connector 112C to removably secure the lighting fixture 116 to the pole 112.

The poles 112 of the street light assemblies 100 have a substantial height (e.g., well over 10 feet) and the installation of the street light assemblies 100 are in locations that are heavily trafficked by people. Modifications to the street light assemblies 100 typically require replacement of the entire lighting fixture 116 at a significant expense. There is a need for an alternative to modifying the street light assemblies 100 to meet the changing needs of the public. Embodiments of the present invention address the foregoing needs as well as others.

SUMMARY

According to aspects illustrated herein, there is provided an extension module for an elongate structure such as a street light fixture and pole assembly. The extension module includes a longitudinal body portion having first coupling (e.g., a tenon) formed on a first end thereof and a second coupling (e.g., a tenon receiving slot) formed on a second end thereof. The extension module includes a first seating surface (e.g., a flange or annular ring) that extends from the longitudinal body and is located between the first end and the second end. The first seating surface is configured to abut a first portion (e.g., a lighting fixture) of the elongate structure. The extension module includes a second seating surface (e.g., should or axial facing surface) extending from the longitudinal body and located between the first end and the second end. The second seating surface is configured to abut a second portion (e.g., a pole) of the elongate structure. One or more mounting members extend radially outward from the longitudinal body.

In one embodiment, one or more access ports extend through the longitudinal body portion and into an interior area of the longitudinal body, for accommodating the passage of conductors therethrough.

According to other aspects illustrated herein, there is provided a fixture for an elongate structure. The fixture includes an extension module having a housing secured therearound. The extension module includes a longitudinal body portion having first connector formed on a first end thereof and a second connector formed on a second end thereof. One or more access ports extend through the longitudinal body portion and into an interior area of the longitudinal body portion, for accommodating the passage of conductors therethrough. The extension module includes a first seating surface extending from the longitudinal body portion and located between the first end and the second end. The first seating surface is configured to abut a first portion of the elongate structure. The extension module includes a second seating surface extending from the longitudinal body portion and located between the first end and the second end, the second seating surface being configured to abut a second portion of the elongate structure. The housing includes a first axial cover extending radially outward from the longitudinal body portion and located proximate the first end of the longitudinal body portion. The housing also includes a second axial cover extending radially outward from the longitudinal body and located proximate the second end of the longitudinal body. The first axial cover and the second axial cover are axially spaced apart from one another and define a space therebetween and around the longitudinal body portion. The space is in communication with an interior of the longitudinal body portion via the access port. A circumferential cover extends circumferentially around radially outermost edges of the first axial cover and the second axial cover and surrounding the space.

In one embodiment, the housing further includes an antenna, a power supply, a computer processor control unit, a signal receiver, a signal transmitter, an AC/DC converter, a camera, a speaker, an internet connection and/or a sensor. The sensor may be any of a temperature sensor, a humidity sensor, a barometric pressure sensor, a sound sensor, a vibration sensor, a smoke sensor and a radiation sensor.

In one embodiment, the elongate structure is a lighting assembly comprising a lighting fixture and a pole and the extension module and housing are positioned between the lighting fixture and the pole such that the extension module is coupled to the pole and the lighting fixture.

According to other aspects illustrated herein, there is provided a housing for an elongate structure. The housing includes a first section and a second section removably secured to one another, the housing is securable around the elongate structure.

The above described and other features are exemplified by the following figures and in the detailed description.

BRIEF DESCRIPTION OF THE DRAWINGS

Referring now to the figures, which are exemplary embodiments, and wherein the like elements are numbered alike:

FIG. 10 is a front elevation view of a street light assembly with the extension module and housing of FIG. 4 partially installed thereon;

FIG. 11 is an enlarged view of the detail 11 portion of FIG. 10;

DETAILED DESCRIPTION

Figure 1:
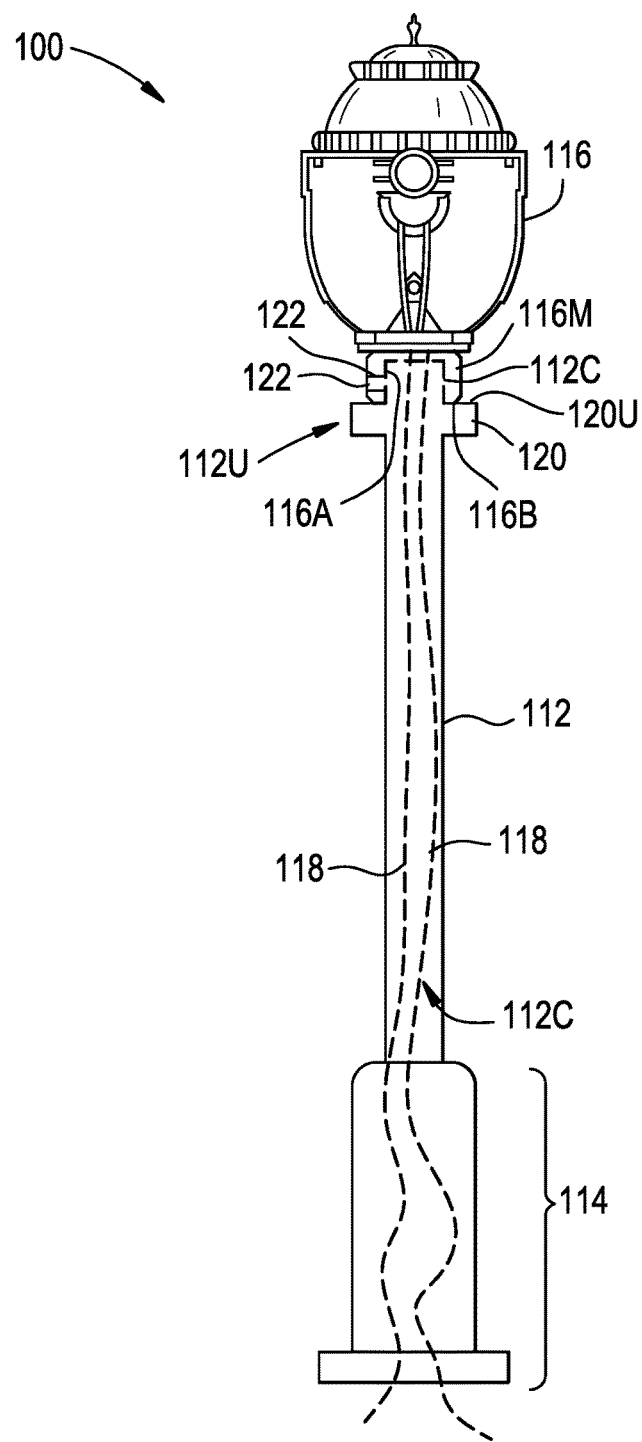
FIG. 1 is a schematic front view of a prior art street light assembly.
Figure 2:
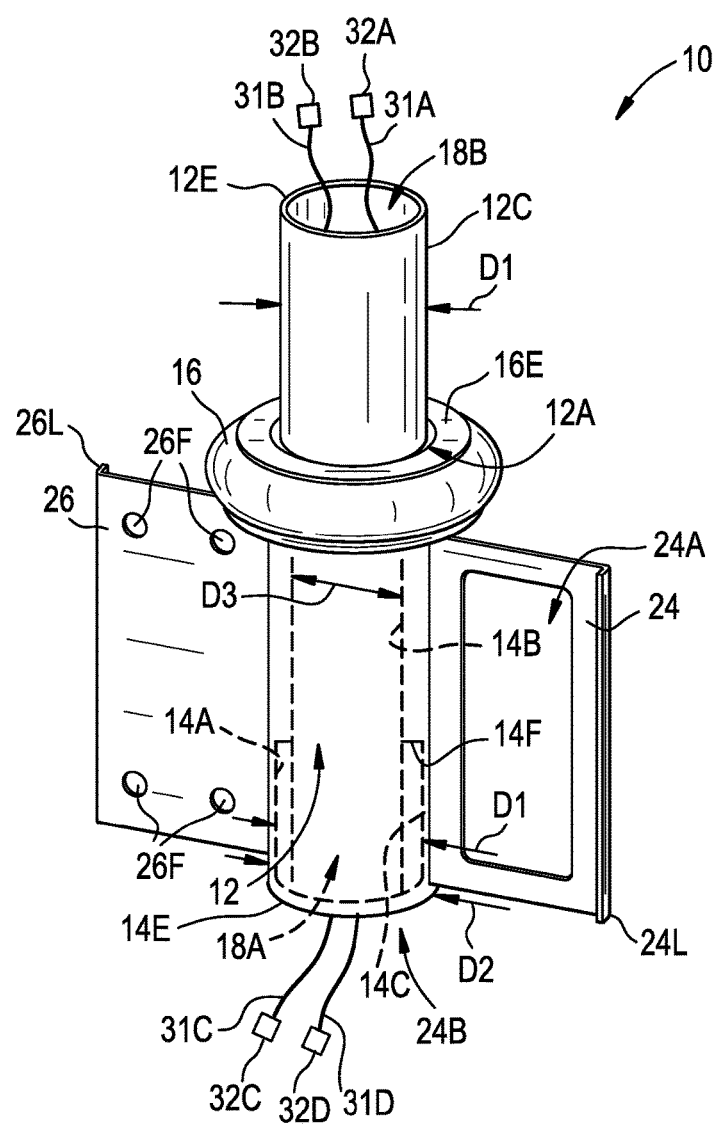
FIG. 2 is a perspective view of one embodiment of an extension module of the present invention.

As shown in FIG. 2, an extension module for an elongate structure 1000 (e.g., a street lighting assembly 1000 having lighting fixture 40 attached to a pole 50 that is attached to a base 51 as shown in FIG. 10, a pole for a cell phone transmitter and receiver, a flag pole, a goal post, a lightning rod pole, or other pole) is generally designated by element number 10. The extension module 10 has utility for in-situ retrofitting the elongate structure 1000 by increasing the length thereof and creating a cite for positioning a housing (e.g., the housing 60 illustrated in FIG. 4), for example by positioning the extension module 10 and the housing 60 between a lighting fixture 40 and pole 50 as shown in FIG. 10. The housing 60 includes various electrical components and sensors and can be installed along with the extension module 10 between the lighting fixture 40 and the pole 50 without having to replace the entire elongate structure or major components (e.g., the lighting fixture 40) thereof and by connecting to existing electrical power supplies, as described herein.

As shown in FIG. 2, the extension module 10 includes a longitudinal body portion 12 (e.g., a cylindrical tube, a tube with a rectangular cross section or other hollow tube) having an outside diameter D2. A coupling member 12C (e.g., a tenon, pipe or tube) having an outside diameter D1 extends axially from a first end 12A of the longitudinal member 12 and is coaxial with the longitudinal body portion 12. The coupling member 12C terminates at an axial end 12E. The coupling member 12C has an interior area 18B extending therethrough. The diameter D2 is greater than the diameter D1. In one embodiment, the extension module 10 and housing 60 are manufactured from a metallic material such as aluminum or other light weight metal.

As shown in FIG. 2, the longitudinal body portion 12 defines a second coupling portion 14C that is defined by a first inside surface 14A formed thereon and extending axially inward from a second end 12B thereof. The first inside surface 14A also has the diameter D1. The first inside surface 14A terminates at a shoulder 14F (e.g., an axially facing surface) that extends radially inward from the first inside surface 14A. A second inside surface 14B extends axially away from the shoulder 14F and terminates at the first end 12A of the longitudinal body portion 12. The second inside surface 14B defines a diameter D3. The diameter D3 is less than the diameter D1 and less than the diameter D2. In one embodiment, the coupling member 12C is integral with the longitudinal body portion 12 and the second inside surface 14B extends axially away from the shoulder 14F and terminates at the axial end 12E of the coupling member 12C, as shown in FIG. 11.

As shown in FIG. 2, an annular ring 16 (e.g., a flange) is secured to the first end 12A of the longitudinal body 12. The annular ring 16 defines a first axial seating surface 16E thereon. In one embodiment, the annular ring 16 is secured to (e.g., welded or brazed) or is integral with the longitudinal body portion 12 such that the first axial seating surface 16E extends from the longitudinal body portion 12. In one embodiment, the first axial seating surface 16E is the first end 12A of the longitudinal body portion 12. The first axial seating surface 16E and the annular ring 16 are located between the first end 12A and the second end 12B of the longitudinal body portion 12. The first axial seating surface 16E is configured to abut a first portion (e.g., an axial bottom portion 40E of a tube 40F of the lighting fixture 40 as shown in FIGS. 10 and 11) of the elongate structure 100.

As shown in FIG. 2, the shoulder 14F defines a second axial seating surface extending from the longitudinal body portion 12 and located between the first end 12A and the second end 12B. In addition, the longitudinal body portion 12 defines a third axial seating surface 14E at the second end 12A thereof. The shoulder 14F and the third axial seating surface 14E are configured to abut a second portion (e.g., portions of the pole 50 as shown in FIG. 10) of the elongate structure 100.

As shown in FIG. 2, the longitudinal body portion 12 includes a first mounting member 24 (e.g., a plate) and a second mounting member 26 (e.g., another plate) extending radially outward therefrom and being aligned therewith. As illustrated in FIG. 2, the first mounting member 24 and the second mounting member 26 are secured (e.g., welded, brazed or integrally formed therewith) to the longitudinal body portion 12 diametrically opposite (i.e., 180 degrees apart from) one another. The first mounting member 24 has an access port 24A extending therethrough. The second mounting member 26 has a plurality of fastening sites (e.g., four threaded holes 26F) extending therethrough for securing components to the second mounting plate. The first mounting member 24 has a lip 24L extending along a radially outermost edge of thereof and second mounting member 26 has a lip 26L extending along a radially outermost edge of thereof. The lips 24L and 26L are configured for securing a hinge 28 thereto. While the first mounting member 24 and the second mounting member 26 are shown and described as being positioned diametrically opposite one another, the present invention is not limited in this regard as the first mounting member 24 and the second mounting member 26 may be asymmetrically positioned relative to one another and/or more than two mounting members may be employed.

Figure 3:
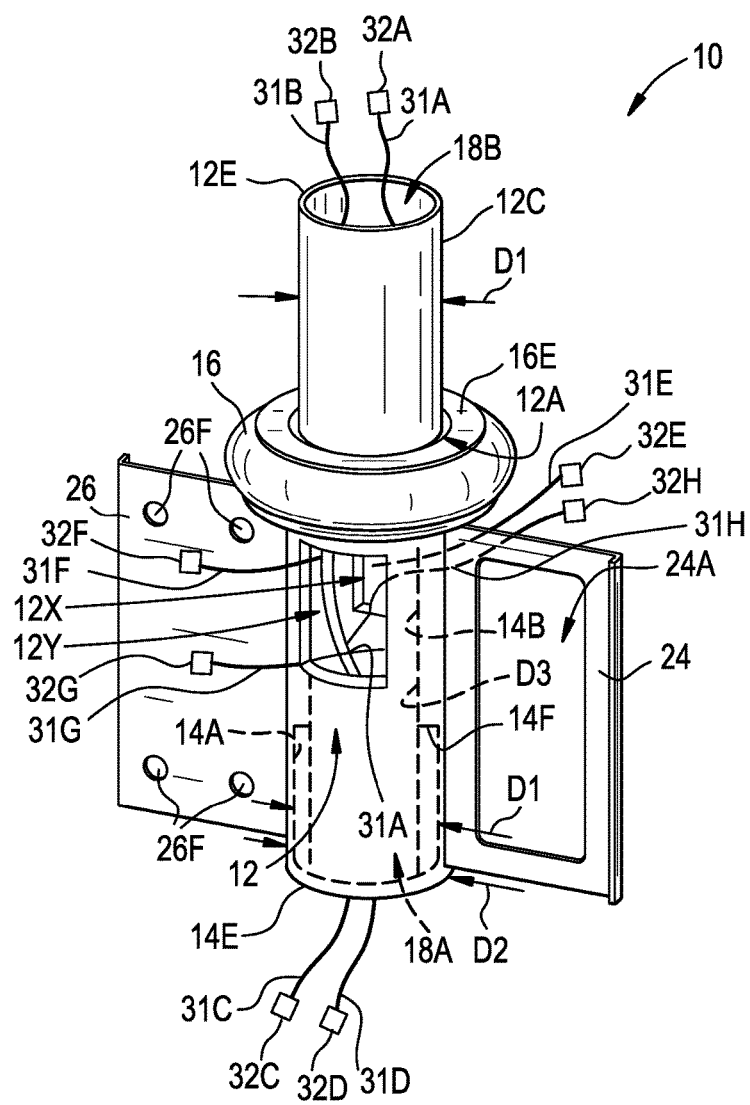
FIG. 3 is a perspective view of another embodiment of an extension module having access ports extending therethrough.

As shown in FIG. 3, the longitudinal body portion 12 has a first access port 12X and a second access port 12Y extending therethrough and into an interior areas 18A and 18B of the coupling member 12C and longitudinal body portion 12, respectively, for accommodating the passage of conductors (e.g., electrical and/or signal conductors 31A-H) therethrough. Electrical conductor 31A extends from the coupling member 12C has electrical connector 32A attached thereto and electrical conductor 31B extends from the coupling member 12C has electrical connector 32B attached thereto. Electrical conductor 31C extends from the longitudinal body portion 12 has electrical connector 32C attached thereto and electrical conductor 31D extends from the coupling member 12D has electrical connector 32D attached thereto. Electrical conductors 31E and 31G communicate with the electrical conductor 31A and electrical conductors 31F and 31H communicate with the electrical conductor 31B. Electrical conductor 31E has electrical connector 32E attached thereto, electrical conductor 31F has electrical connector 32F attached thereto, electrical conductor 31G has electrical connector 32G attached thereto and electrical conductor 31H has electrical connector 32H attached thereto. The electrical conductors 31E and 31H extend through the first access port 12X into a space 63 of the housing 60 (see FIG. 11) and electrical conductors 31F and 31G extend through the second access port 12Y into the space 63 of the housing 60, as described further herein.

As shown in FIG. 11, the electrical connector 32B is connected to electrical connector 21B of an electrical conductor 19B of a lighting fixture 40 portion of the lighting assembly 1000 shown in FIG. 10 and the electrical connector 32A is connected to electrical connector 21A of an electrical conductor 19A of a lighting fixture 40 portion of the lighting assembly. As shown in FIG. 11, the electrical connector 32C is connected to electrical connector 21C of an electrical conductor 19C of extending through the pole 50 portion of the lighting assembly 1000 as shown in FIG. 10 and the electrical connector 32D is connected to electrical connector 21D of an electrical conductor 19D extending through pole 50 portion of the lighting assembly 1000.

Figure 4:
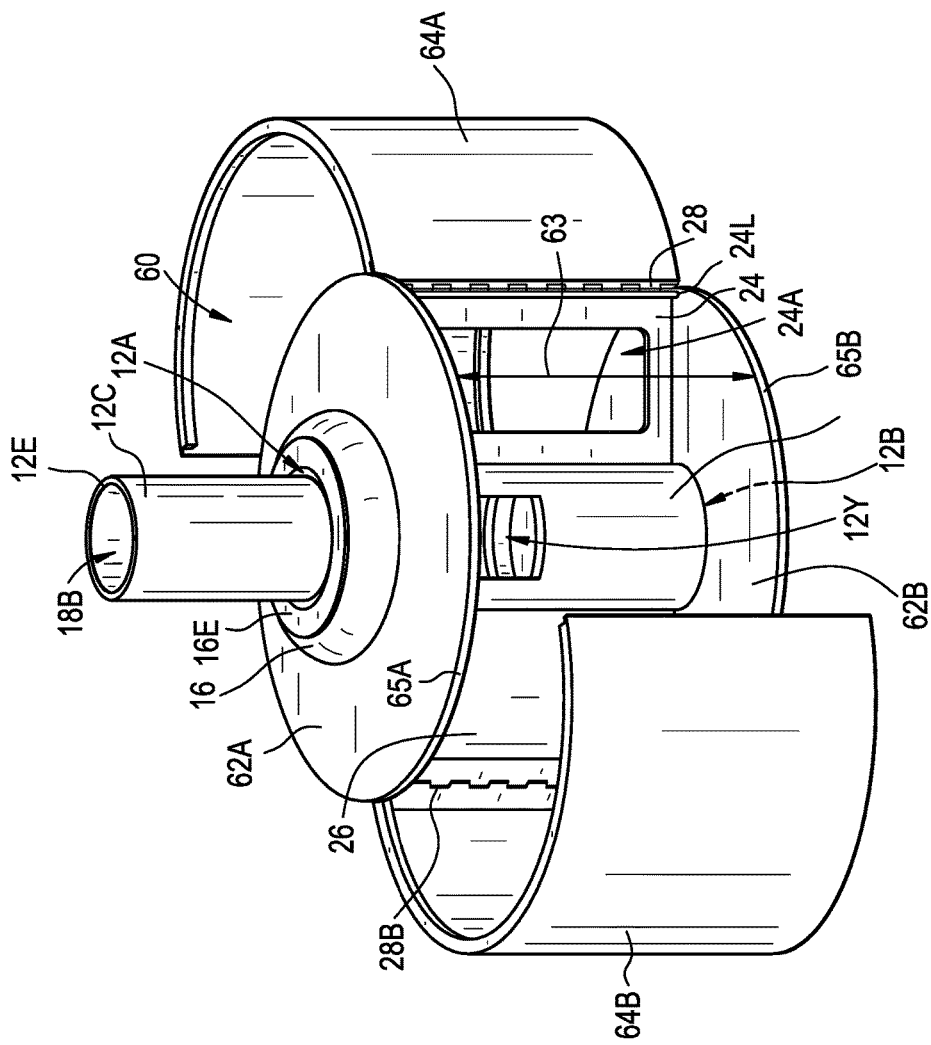
FIG. 4 is a front perspective view of the extension module of FIG. 3 illustrated with a cylindrical housing secured thereround.
Figure 5:
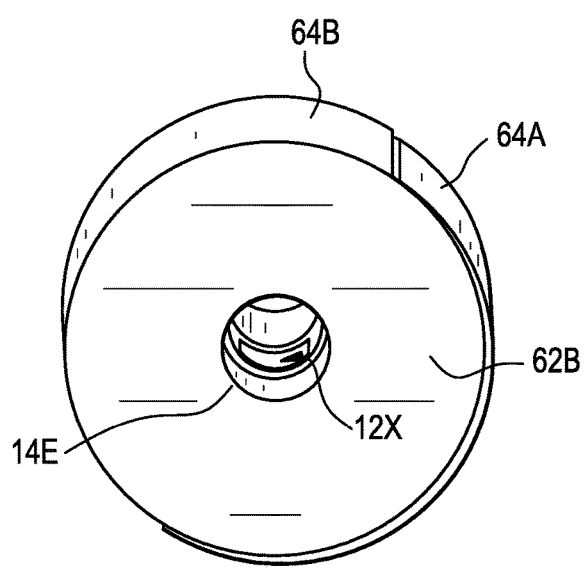
FIG. 5 is a bottom perspective view of the extension module and housing of FIG. 4.

As shown in FIG. 10 a fixture 1001 for an elongate structure 1000 (e.g., a lighting assembly) includes the extension module 10 having a housing 60 secured therearound. In one embodiment, the housing 60 is manufactured from a metallic material such as aluminum or other light weight metal. The extension module 10 and housing 60 are positioned between the lighting fixture 40 and the pole 50 such that the extension module 10 is coupled to the pole 50 and the lighting fixture 40. As shown in FIGS. 4 and 11, the housing 60 includes a first axial cover 62A extending radially outward from the longitudinal body 12 and located proximate the first end 12A of the longitudinal body 12. The housing 60 includes a second axial cover 62B extending radially outward from the longitudinal body 12 and located proximate the second end 12B of the longitudinal body 12. The first axial cover 62A and the second axial cover 62B are axially spaced apart from one another and define a space 63 therebetween and around the longitudinal body portion 12. The space 63 is in communication with the interior area 18A of the longitudinal body portion 12 via the first access port 12X and second access port 12Y. A first circumferential cover 64A and a second circumferential cover 64B cooperate to extend circumferentially around radially outermost edges 67A and 67B of the first axial cover 62A and the second axial cover 62B, respectively, and surrounding the space 63 as shown in FIGS. 5 and 11. The first circumferential cover 64A and the second circumferential cover 62B are arcuately shaped, for example, in a half circle configuration. The first circumferential cover 64A is pivotally attached to the lip 24L of the first mounting plate 24 via a hinge 28 secured to the lip 24L and the first circumferential cover 62A. The second circumferential cover 64B is pivotally attached to the lip 26L of the second mounting plate 26 via another hinge 28 secured to the lip 26L and the second circumferential cover 62B. The first circumferential cover 62A and the second circumferential cover 62B are pivotal about the respective hinge 28 to open (see FIGS. 4 and 6-9 for an open configuration) to allow access to the space 63 and to close to enclose the space 63 (see FIGS. 5 and 11 for a closed configuration). As shown in FIG. 8, fasteners 65A and 65B are attached to each of the first circumferential cover 64A and the second circumferential cover 64B to secure them in the closed position of FIGS. 5 and 11.

As shown in FIGS. 10 and 11, the housing 60 and extension module 10 are installed between the lighting fixture 40 and the pole 50. The housing 60 and extension module 10 are installed on the pole 50 so that an axial end 50F of the pole tenon 50T engages the shoulder 14F and an axial end 50E of the pole 50 engages the third axial seating surface 14E of the longitudinal body portion 12 (or a bottom portion of the second axial cover 62B). Two fasteners 89 (e.g., allen head set screws) are threaded through the longitudinal body portion 12 and frictionally engage the tenon 50T. When the installation is complete, a female stem section 40F of the lighting fixture 40 is fit over the coupling member 12C. An axial end 40E of the stem section 40 F engages and seats on the first axial seating surface 16E of the annular ring 16. Two fasteners 91 (e.g., allen head set screws) are threaded through the stem section 40F and frictionally engage the coupling member 12C. The housing 60 and extension module 10 are configured to support the weight of the lighting fixture 40, to withstand traverse loads such as wind loads and to withstand impact loads from projectiles.

As shown in FIG. 4 the first mounting member 24 extending radially outward from the longitudinal body 12 and extends axially between and is secured (e.g., welded or brazed) to axially inward facing surfaces of the first axial cover 62A and the second axial cover 62B.

Figure 6:
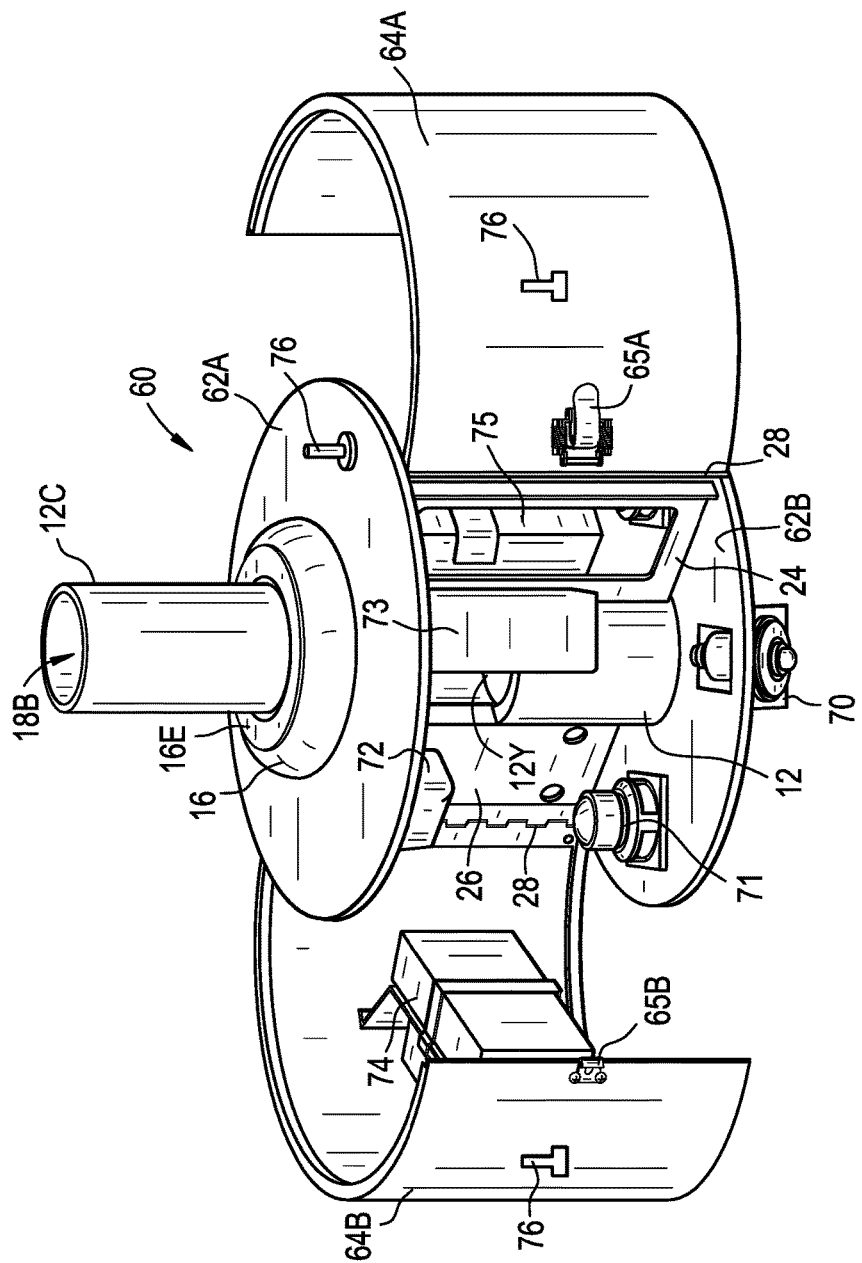
FIG. 6 is a front perspective view of the extension module and housing of FIG. 4 shown with components disposed therein.
Figure 7:
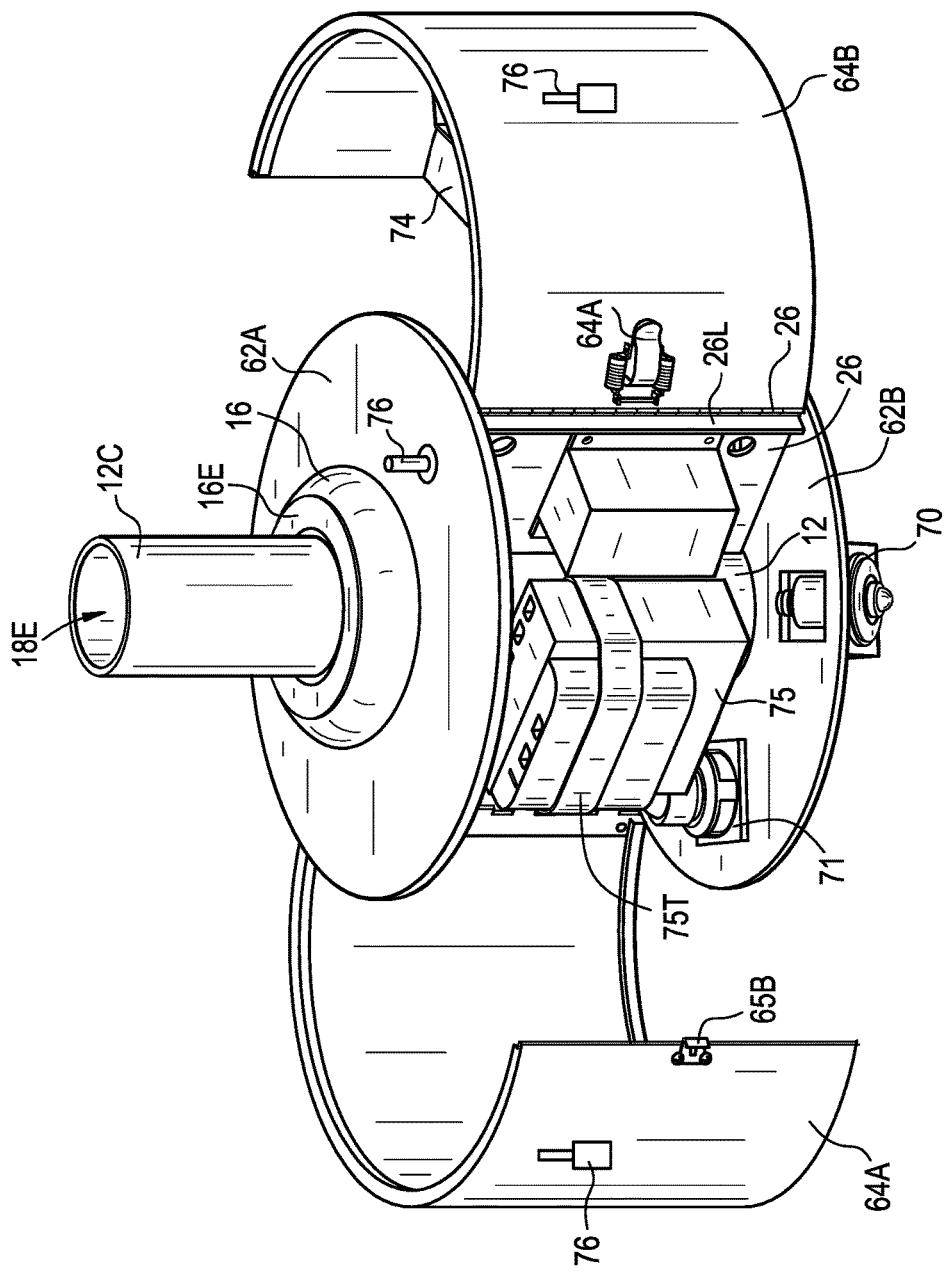
FIG. 7 is a rear perspective view of the extension module and housing of FIG. 4 shown with components disposed therein.
Figure 8:
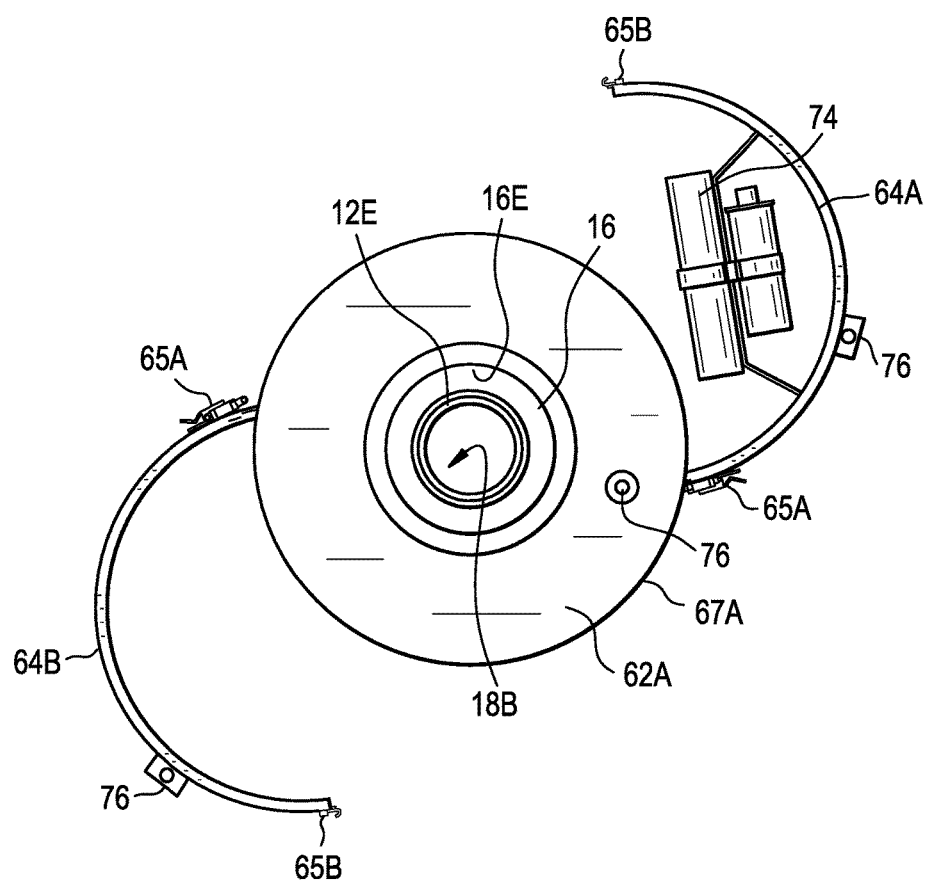
FIG. 8 is a bottom view of the extension module and housing of FIG. 7.
Figure 9:
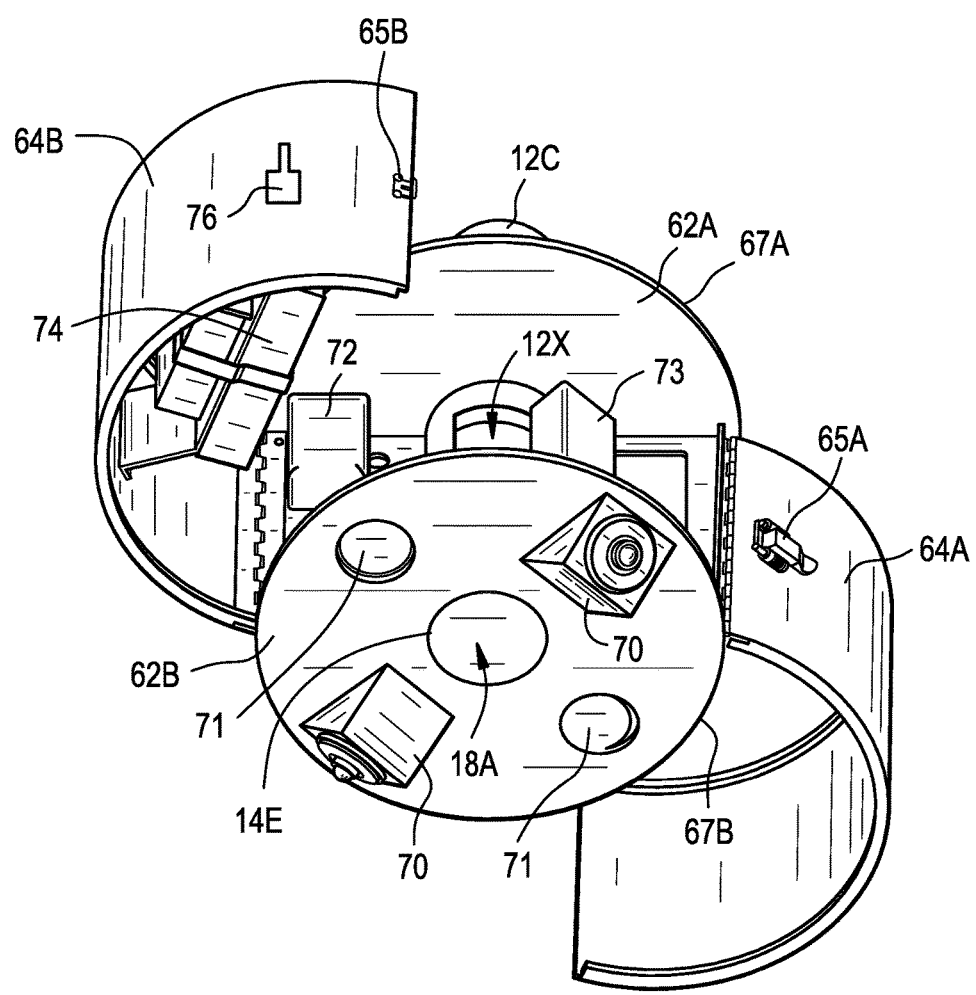
FIG. 9 is a bottom perspective view of the extension module and housing of FIG. 6.
Figure 12A:
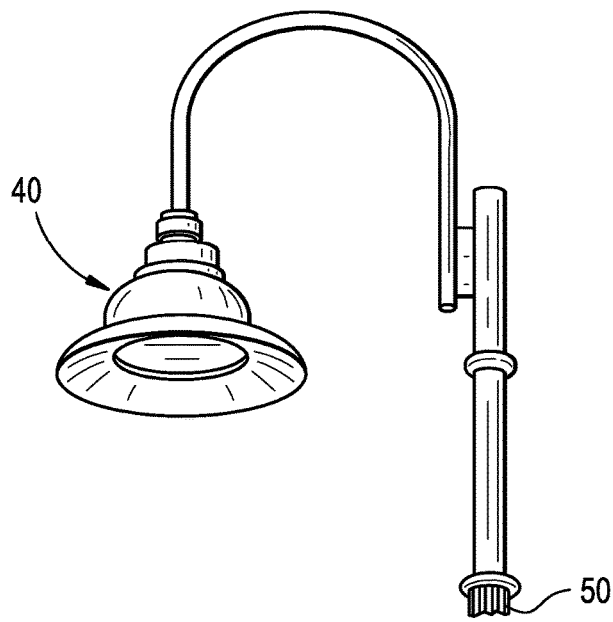
FIG. 12A is a perspective view of another embodiment of a lighting fixture installed on a pole.
Figure 12B:
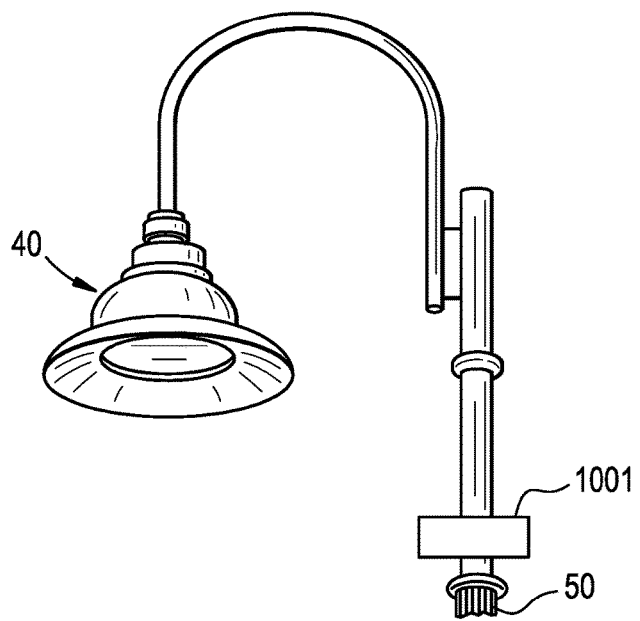
FIG. 12B is a perspective view of the lighting fixture and pole of FIG. 12A shown with the extension module and housing of FIG. 4 installed thereon.
Figure 13A:
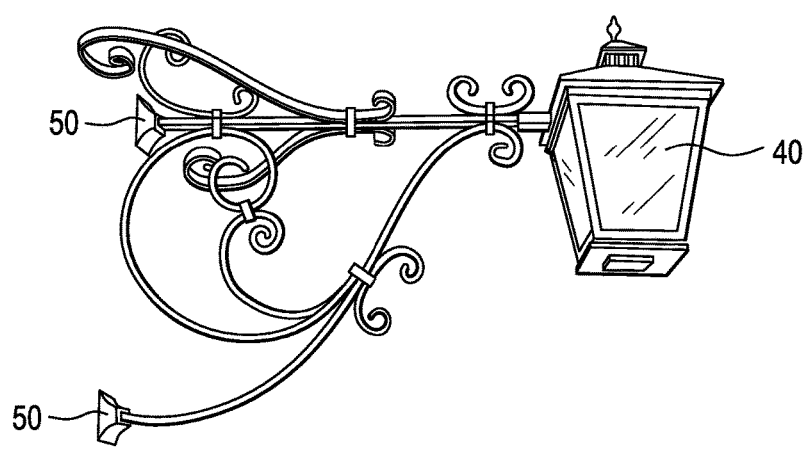
FIG. 13A is a perspective view of another embodiment of a lighting fixture installed on a pole.
Figure 13B:
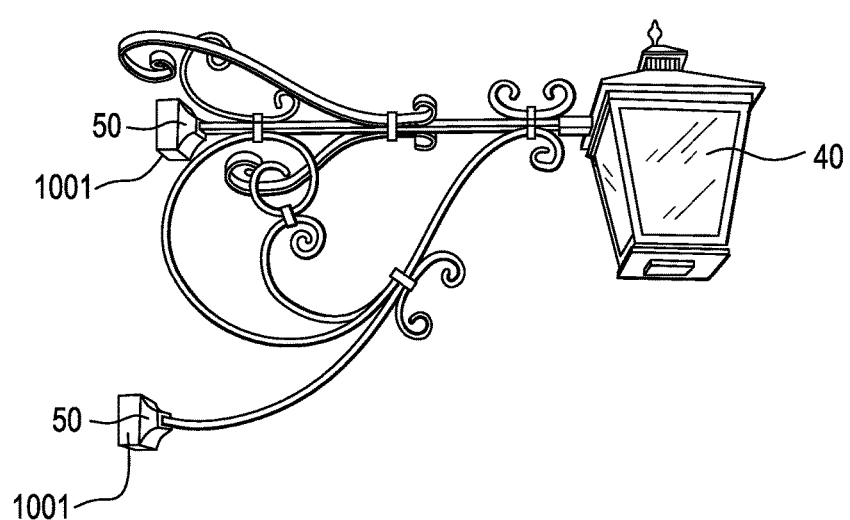
FIG. 13B is a perspective view of the lighting fixture and pole of FIG. 13A shown with another embodiment of the extension module and housing of FIG. 4 installed thereon.
Figure 14A:
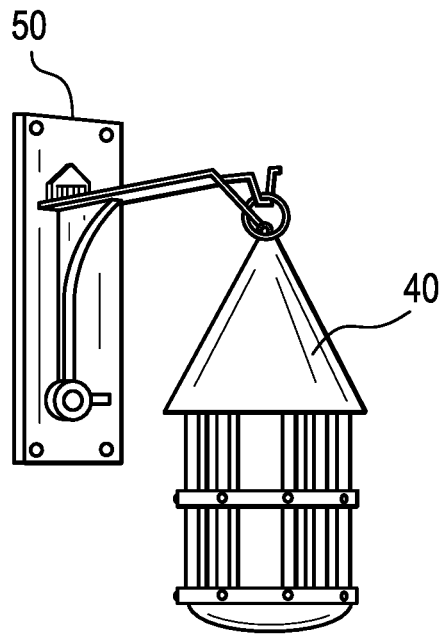
FIG. 14A is a perspective view of another embodiment of a lighting fixture installed on a pole.
Figure 14B:
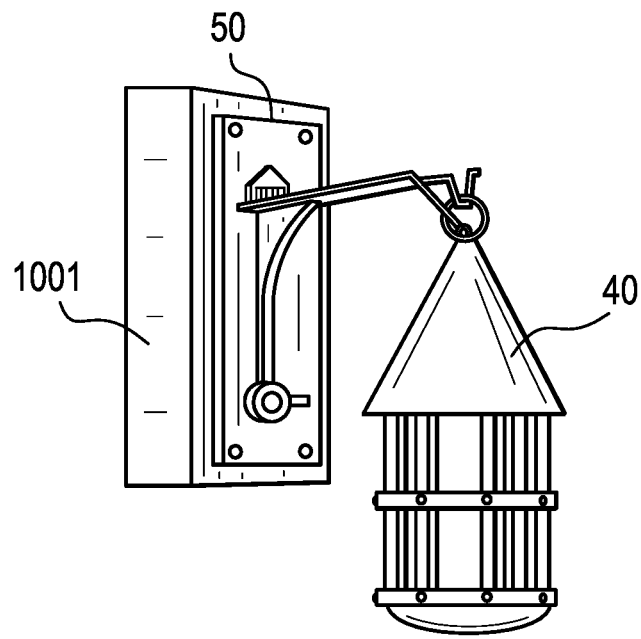
FIG. 14B is a perspective view of the lighting fixture and pole of FIG. 14A shown with another embodiment of the extension module and housing of FIG. 4 installed thereon.
Figure 15A:
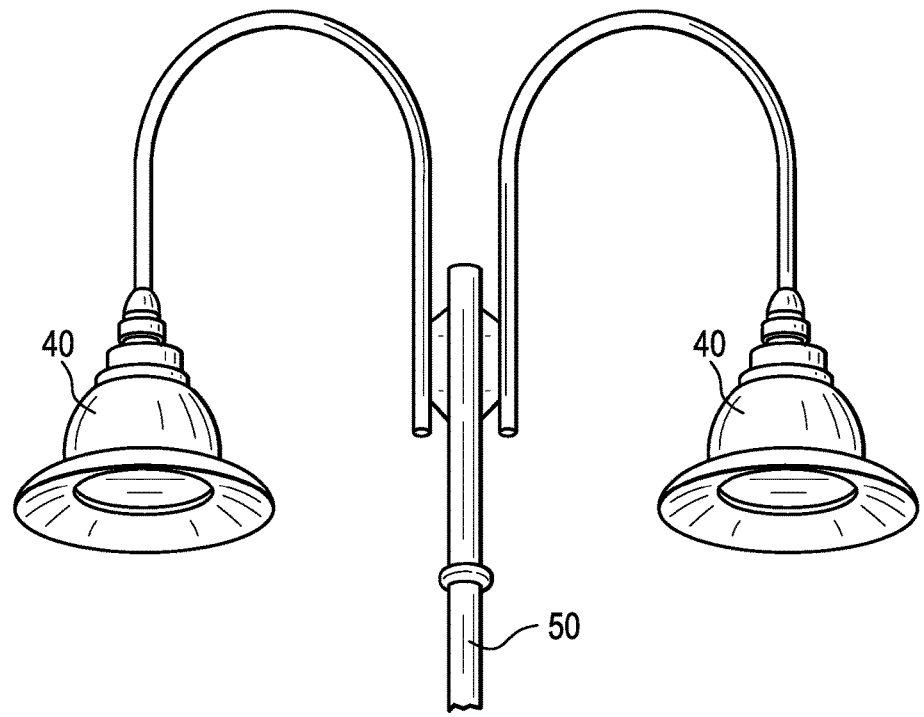
FIG. 15A is a perspective view of another embodiment of a lighting fixture installed on a pole.
Figure 15B:
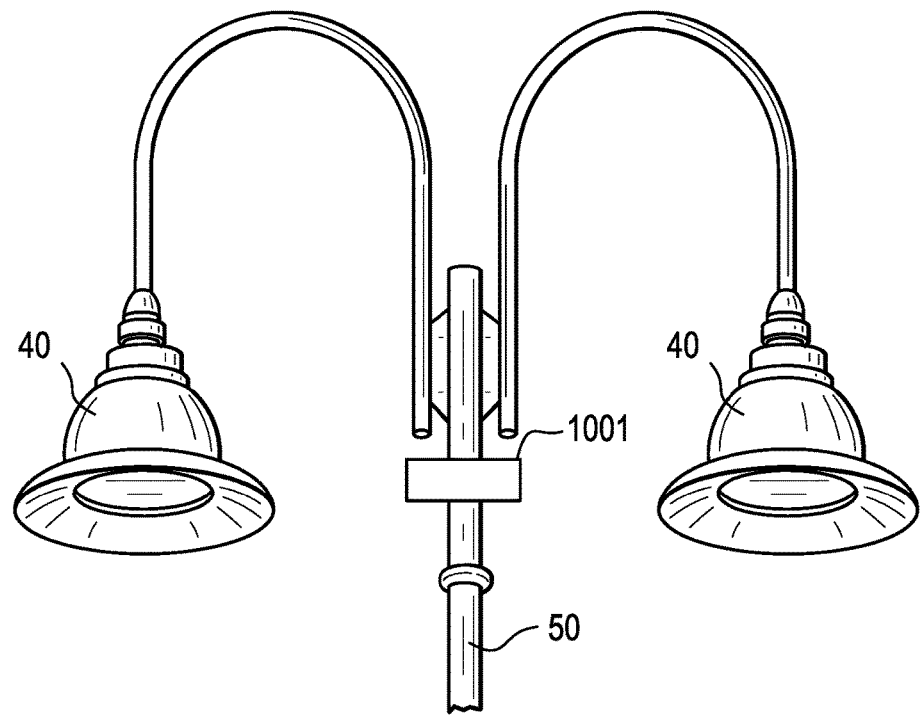
FIG. 15B is a perspective view of the lighting fixture and pole of FIG. 15A shown with the extension module and housing of FIG. 4 installed thereon.
Figure 16A:
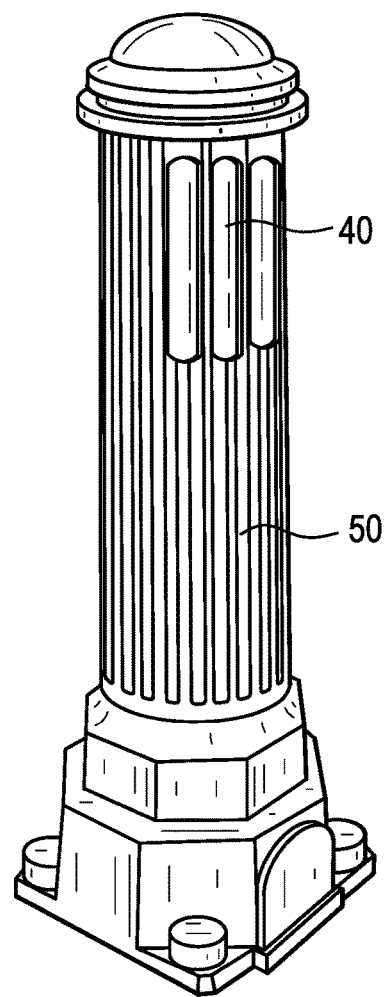
FIG. 16A is a perspective view of another embodiment of a lighting fixture installed on a pole.
Figure 16B:
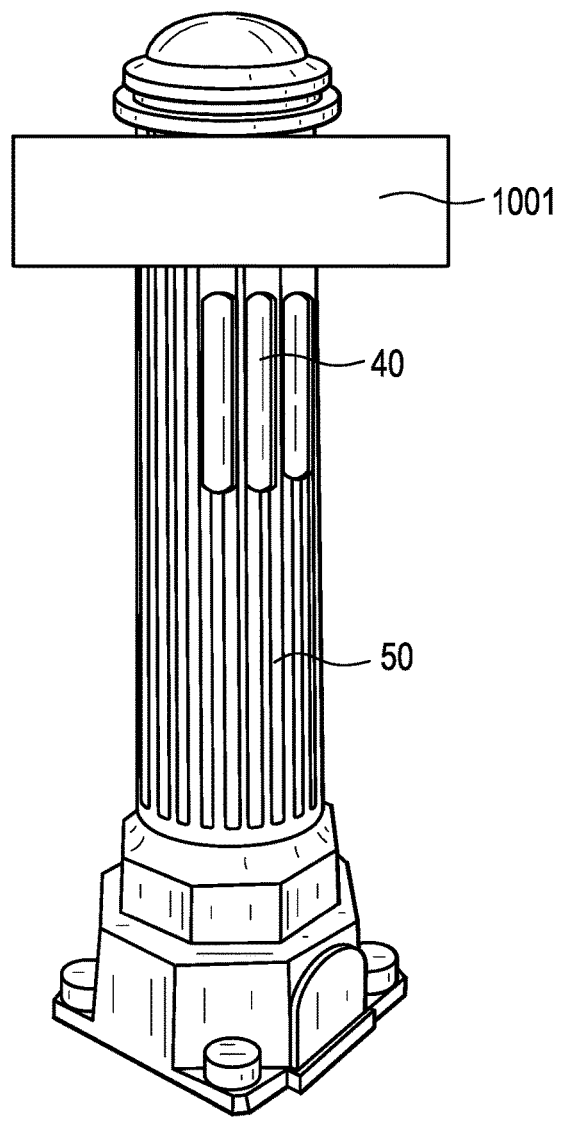
FIG. 16B is a perspective view of the lighting fixture and pole of FIG. 16A shown with the extension module and housing of FIG. 4 installed thereon.

As shown in FIGS. 6, 7 and 9, the housing 60 further comprises at least one of an antenna 76 mounted on the first axial cover 62A, another antenna mounted on the first circumferential cover 64A and another antenna mounted on the second circumferential cover 64B. Two cameras 70 are shown extending through and mounted to the second axial cover 62B. Two speakers 71 are shown extending through and mounted to the second axial cover 62B. A power supply 72 is mounted to the second mounting member 26. An AC/DC converter 73 is mounted to the longitudinal body portion 12. A power supply and computer processor control unit 74 is mounted to the second circumferential cover 64B for controlling the cameras 70. As shown in FIG. 7 a main computer processor control unit 75 is mounted to the longitudinal body portion 12 via a strap 75T. The housing 60 is also configured to contain a signal receiver, a signal transmitter, an internet connection and various sensors, such as but not limited to a temperature sensor, a humidity sensor, a barometric pressure sensor, a sound sensor, a vibration sensor, a smoke sensor and a radiation sensor. In one embodiment, the power supply 72 or 74 includes one or more batteries. The cameras 70, the speakers 71, the power supply 72, the AC/DC converter 73, power supply and computer processor control unit 74, main computer processor control unit 75, the antennas 76 and the signal receiver, signal transmitter, internet connection and the various sensors are connected to one another by suitable electrical and signal conductors and communicate with and are controlled via the main computer processor control unit 75.

While the fixture 1001 (i.e., the extension module 10 and the housing 60) is shown and described in FIGS. 10 and 11 to be positioned between the lighting fixture 40 and the pole 50 such that the extension module 10 is coupled to the pole 50 and the lighting fixture 40, the present invention is not limited in this regard as the fixture 1001 may be installed in various other configurations including but not limited to a pole for a cell phone transmitter and receiver, a flag pole, a goal post, a lightning rod pole, or other lighting assemblies as shown in FIGS. 12A, 12B, 13A, 13B, 14A, 14B, 15A, 15B, 16A and 16B.

Figure 17A:
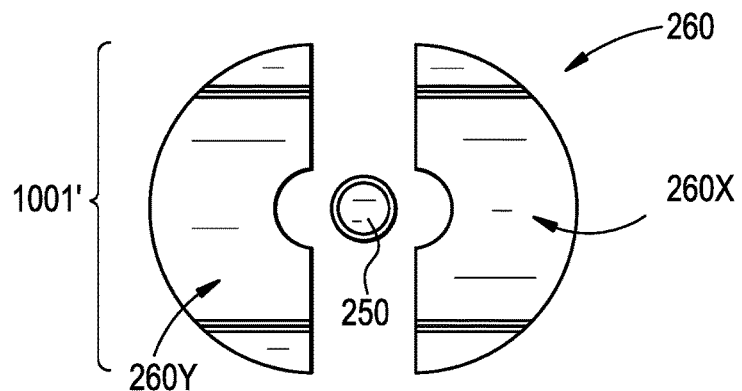
FIG. 17A is a cross sectional view of another embodiment of a housing before being secured to a pole.
Figure 17B:
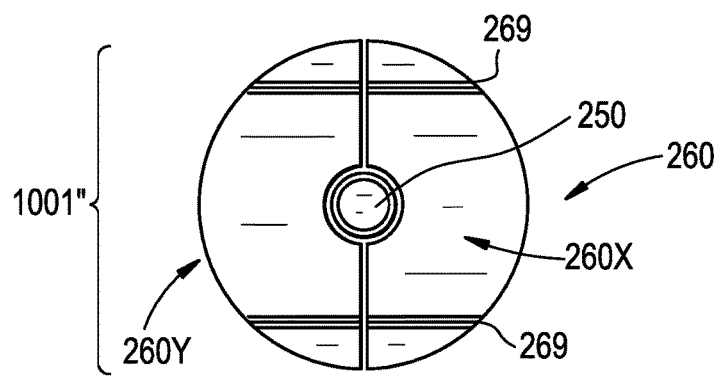
FIG. 17B is a cross sectional view of housing of FIG. 17A shown secured to the pole.
Figure 17C:
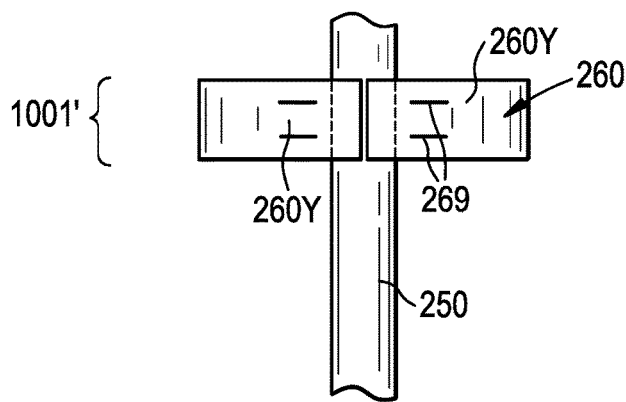
FIG. 17C is a front elevation view of housing and pole of FIG. 17B.

As shown in FIGS. 17A-17C a modular self-contained version of the fixture 1001' is shown having a housing 260 secured to a pole 250. The housing 260 includes a first section 260X and a second section 260Y removably secured to one another via fasteners 269. The housing 260 is securable around the pole 250 in-situ without having to remove or disassemble any exist components such as removing and replacing a lighting fixture on the pole. The housing 260 includes an antenna, a power supply, a computer processor control unit, a signal receiver, a signal transmitter, an AC/DC converter, a camera, a speaker, an internet connection and a sensor. The power supply is a battery. In one embodiment, the housing 260 is manufactured from a lightweight and high strength plastic or a composite material. In one embodiment, the antenna, power supply, computer processor control unit, signal receiver, signal transmitter, AC/DC converter, camera, speaker, internet connection and/or sensor are prefabricated in or on the housing 260, for example, using printed circuit boards, printed electronics and/or mass produced box build manufacturing technologies.

While the invention has been described with reference to various exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Moreover, it is noted that the features and elements described herein can be employed in any combination with other features and/or elements, embodiments and so forth described herein.

What is claimed is:

1. An extension module for an elongate structure, the extension module comprising:
    a longitudinal body portion having first coupling formed on a first end thereof and a second coupling formed on a second end thereof;
    a first seating surface extending from the longitudinal body and located between the first end and the second end, the first seating surface being configured to abut a first portion of the elongate structure;
    a second seating surface extending from the longitudinal body and located between the first end and the second end, the second seating surface being configured to abut a second portion of the elongate structure; and
    at least one mounting member extending radially outward from the longitudinal body.

2. The extension module of claim 1, further comprising at least one first access port extending through the longitudinal body portion and into an interior area of the longitudinal body, for accommodating passage of conductors therethrough.

3. The extension module of claim 1, further comprising at least one electrical conductor with at least one electrical connector attached there to, the at least one electrical connector being configured for electrical communication with at least one of the first portion of the elongate structure and the second portion of the elongate structure.

4. The extension module of claim 1, wherein the at least one mounting member comprises a first plate having at least one second access port extending therethrough.

5. The extension module of claim 1, wherein the at least one mounting member comprises a second plate having at least one fastening member formed therein.

6. The extension module of claim 1, wherein the longitudinal body comprises a hollow cylindrical tube.

7. The extension module of claim 1, wherein the first seating surface comprises an axially facing surface of a flange extending radially outward from the longitudinal member.

8. The extension module of claim 1, wherein the second seating surface comprises an axially facing surface extending radially inward from the longitudinal member.

9. The extension module of claim 1, wherein the second seating surface comprises an axially facing surface of the longitudinal member.

10. A fixture for an elongate structure, the fixture comprising:
    an extension module having a housing secured therearound;
    the extension module comprising:
        a longitudinal body portion having first connector formed on a first end thereof and a second connector formed on a second end thereof, at least one first access port extending through the longitudinal body portion and into an interior area of the longitudinal body portion, for accommodating the passage of conductors therethrough;

a first seating surface extending from the longitudinal body portion and located between the first end and the second end, the first seating surface being configured to abut a first portion of the elongate structure; and a second seating surface extending from the longitudinal body portion and located between the first end and the second end, the second seating surface being configured to abut a second portion of the elongate structure;

the housing comprising:

a first axial cover extending radially outward from the longitudinal body portion and located proximate the first end of the longitudinal body portion;

a second axial cover extending radially outward from the longitudinal body and located proximate the second end of the longitudinal body;

the first axial cover and the second axial cover being axially spaced apart from one another and defining a space therebetween and around the longitudinal body portion, the space being in communication with an interior of the longitudinal body portion via the at least one first access port; and a circumferential cover extending circumferentially around radially outermost edges of the first axial cover and the second axial cover and surrounding the space.

11. The fixture of claim 10, further comprising at least one mounting member extending radially outward from the longitudinal body portion and extending axially between and secured to axially inward facing surfaces of the first axial cover and the second axial cover.

12. The fixture of claim 11, wherein the at least one mounting member comprises a first plate having at least one second access port extending therethrough.

13. The fixture of claim 11, wherein the at least one mounting member comprises a second plate having at least one fastening member formed therein.

14. The fixture of claim 10, wherein the circumferential cover comprises at least one of a first circumferential cover section and a second circumferential section.

15. The fixture of claim 14, wherein at least one of the first circumferential section and the second circumferential section is hingedly mounted to the at least one of the first axial cover and the second axial cover, respectively, so that at least one of the first circumferential section and the second circumferential section is pivotally moveable relative to the first axial cover and the second axial cover.

16. The fixture of claim 10, further comprising at least one electrical conductor with at least one electrical connector attached thereto, the at least one electrical connector being configured for electrical communication with at least one of the first portion of the elongate structure and the second portion of the elongate structure.

17. The fixture of claim 10, wherein the longitudinal body portion comprises a hollow cylindrical tube.

18. The fixture of claim 10, wherein the first seating surface comprises an axially facing surface of a flange extending radially outward from the longitudinal body portion.

19. The fixture of claim 10, wherein the second seating surface comprises an axially facing surface extending radially inward from the longitudinal body portion.

20. The fixture of claim 10, wherein the second seating surface comprises an axially facing surface of the longitudinal body portion.

21. The fixture of claim 10, wherein the housing further comprises at least one of an antenna, a power supply, a computer processor control unit, a signal receiver, a signal transmitter, an AC/DC converter, a camera, a speaker, an internet connection and a sensor.

22. The fixture of claim 21, wherein the sensor comprises at least one of a temperature sensor, a humidity sensor, a barometric pressure sensor, a sound sensor, a vibration sensor, a smoke sensor and a radiation sensor.

23. The fixture of claim 21, wherein the power supply is a battery.

24. The fixture of claim 10, wherein the elongate structure is a lighting assembly comprising a lighting fixture and a pole and wherein the extension module and the housing are positioned between the lighting fixture and the pole such that the extension module is coupled to the pole and the lighting fixture.

* * * * *